United States Patent [19]
Koizumi et al.

[11] Patent Number: 5,801,764
[45] Date of Patent: Sep. 1, 1998

[54] MONITOR DEVICE AND MONITOR METHOD

[75] Inventors: Hiroto Koizumi, Yamanashi; Hidehito Yokomori, Nirasaki, both of Japan

[73] Assignee: Tokyo Electron Limited, Tokyo, Japan

[21] Appl. No.: 912,647

[22] Filed: Aug. 18, 1997

Related U.S. Application Data

[63] Continuation of Ser. No. 499,950, Jul. 10, 1995, abandoned.

[30] Foreign Application Priority Data

Jul. 11, 1994 [JP] Japan .................................. 6-158943
Jul. 11, 1994 [JP] Japan .................................. 6-158944

[51] Int. Cl.$^6$ ............................. H04N 7/18; H04N 9/47
[52] U.S. Cl. ......................... 348/125; 348/126; 348/87; 348/94
[58] Field of Search .......................... 348/125, 126, 348/128, 129, 94, 82, 87, 86; H04N 7/18, 9/47

[56] References Cited

U.S. PATENT DOCUMENTS

| | | | |
|---|---|---|---|
| 2,861,699 | 11/1958 | Youmans | 348/42 |
| 4,064,534 | 12/1977 | Chen et al. | 348/82 |
| 4,737,845 | 4/1988 | Suzuki et al. | 348/87 |
| 5,129,009 | 7/1992 | Lebeau | 348/87 |
| 5,136,948 | 8/1992 | Fujino et al. | 348/87 |
| 5,204,739 | 4/1993 | Domenicali | 348/87 |
| 5,422,579 | 6/1995 | Yamaguchi | 348/87 |
| 5,432,461 | 7/1995 | Henley | 348/129 |
| 5,471,310 | 11/1995 | Spigarelli et al. | 348/87 |
| 5,528,266 | 6/1996 | Arbeitman et al. | 345/173 |
| 5,534,892 | 7/1996 | Tagawa | 345/173 |
| 5,543,588 | 8/1996 | Bisset et al. | 345/173 |

*Primary Examiner*—Tommy P. Chin
*Assistant Examiner*—Nhon T. Diep
*Attorney, Agent, or Firm*—Oblon, Spivak, McClelland, Maier & Neustadt, P.C.

[57] ABSTRACT

A monitor device for monitoring an object to be tested is provided in a test apparatus which includes a test section for testing the electrical characteristics of the object, a storage section for storing the object, and a transfer section for conveying the object between the storage section and the test section. This monitor device includes an imaging device used in alignment of the object in the test section, a sensor for sensing the position of the object in the transfer section, and a display panel for displaying an image of the interior of the test apparatus and displaying the alignment state in the test section and the position information of the object in the transfer section in the image of the test apparatus.

27 Claims, 9 Drawing Sheets

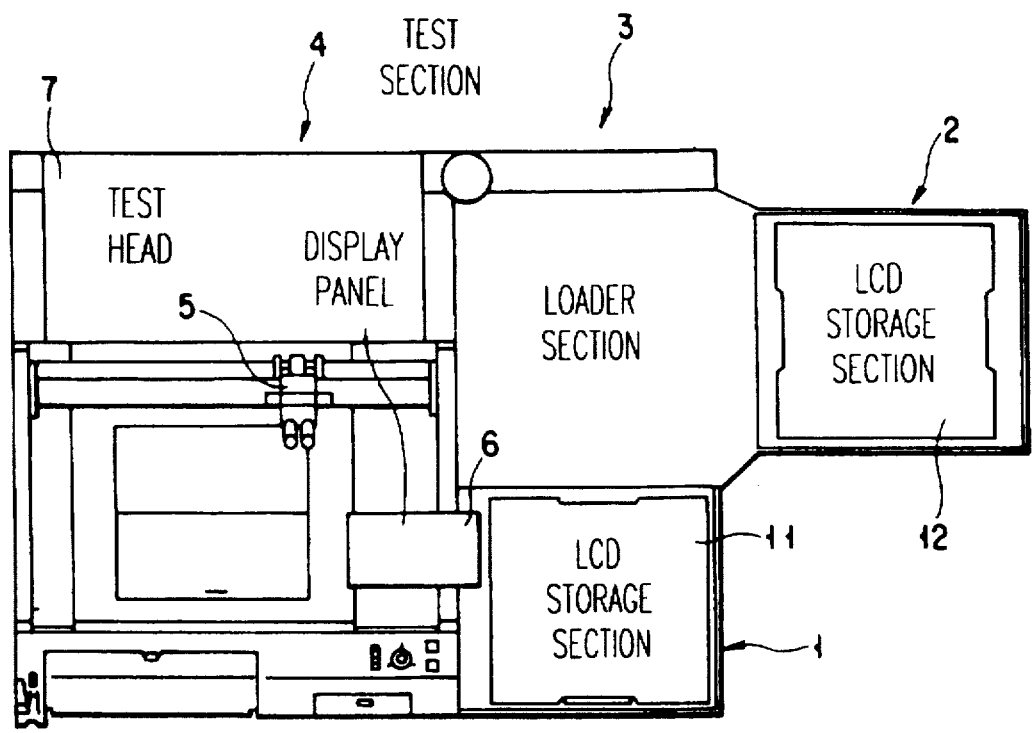
F I G. 1
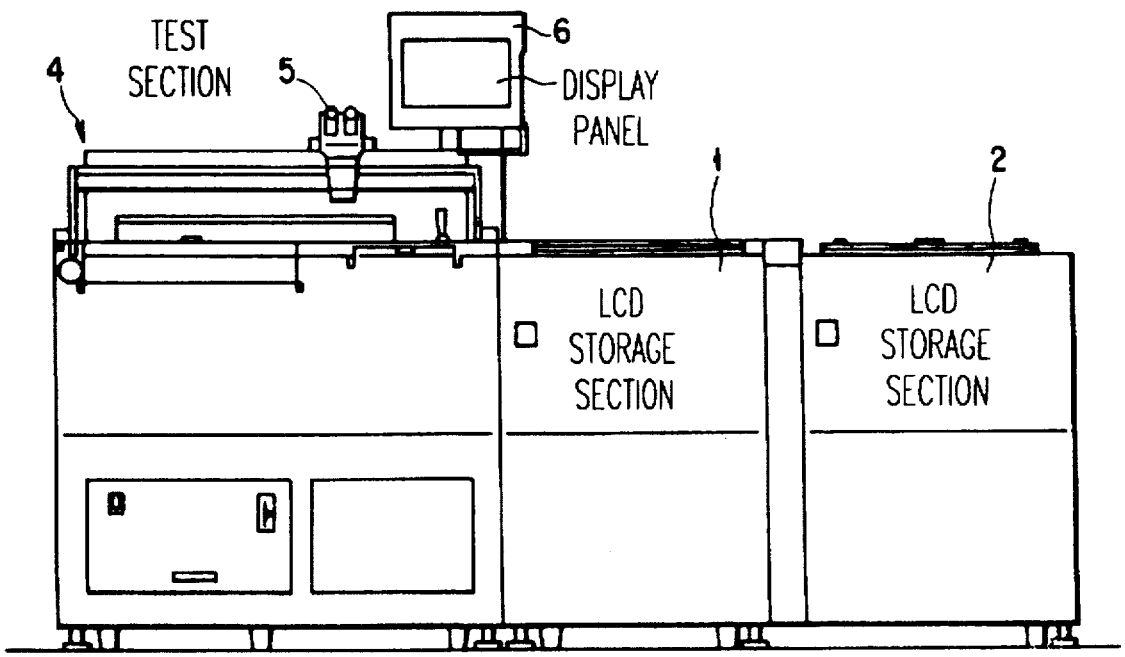
F I G. 2

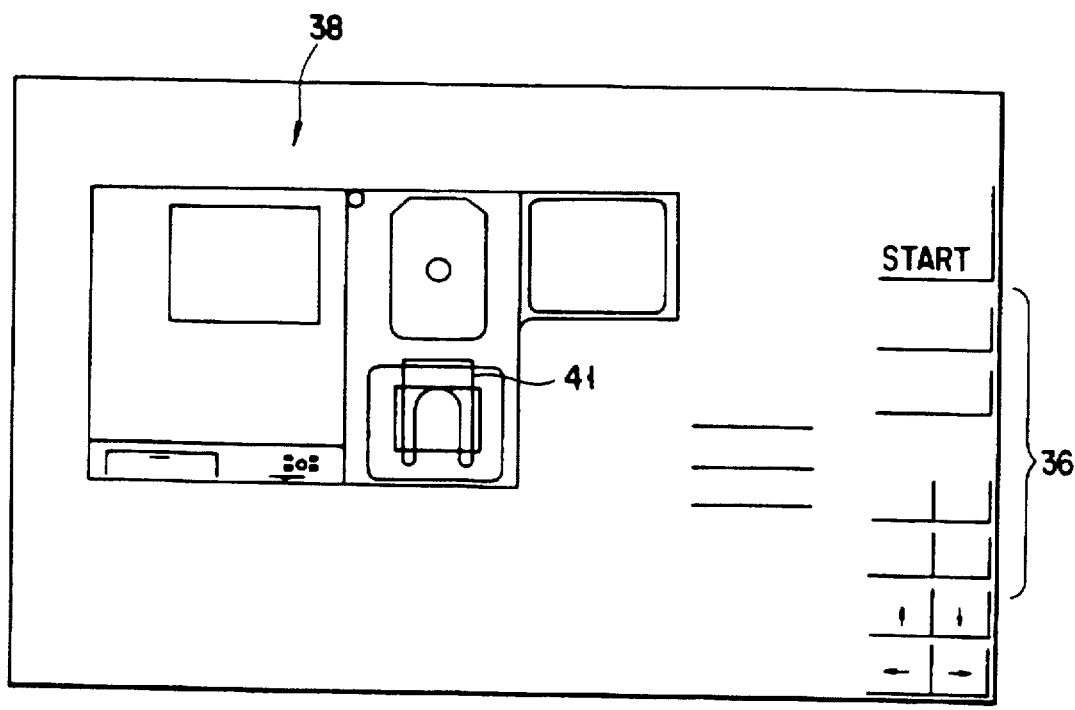
F I G. 7A
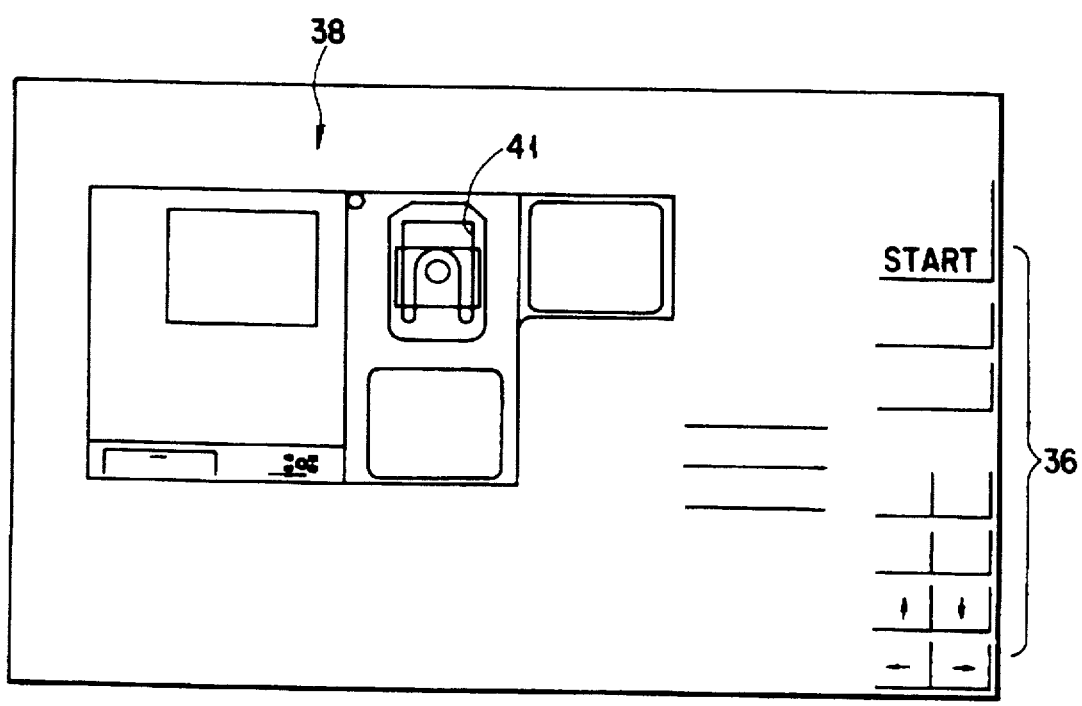
F I G. 7B

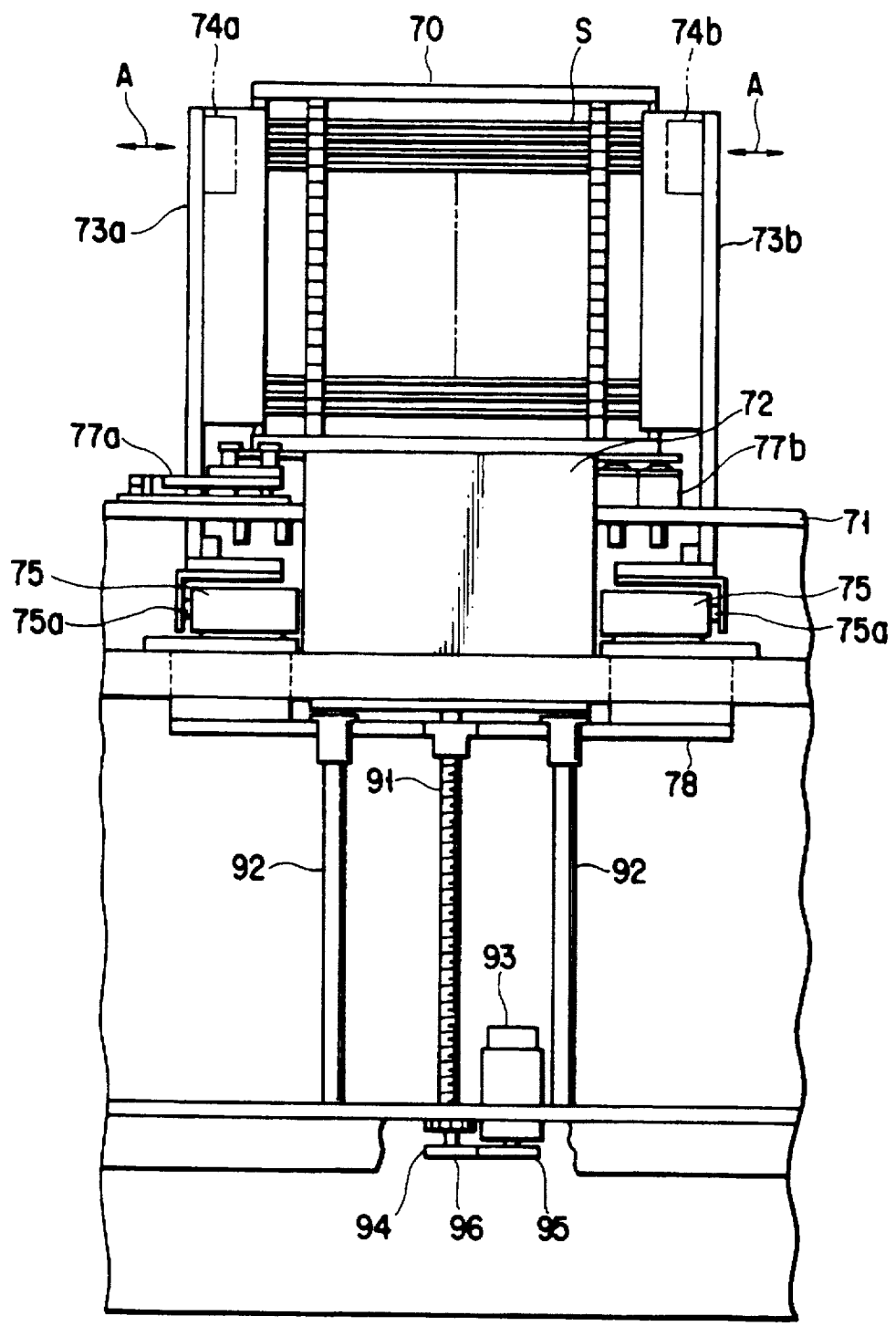
F I G. 11

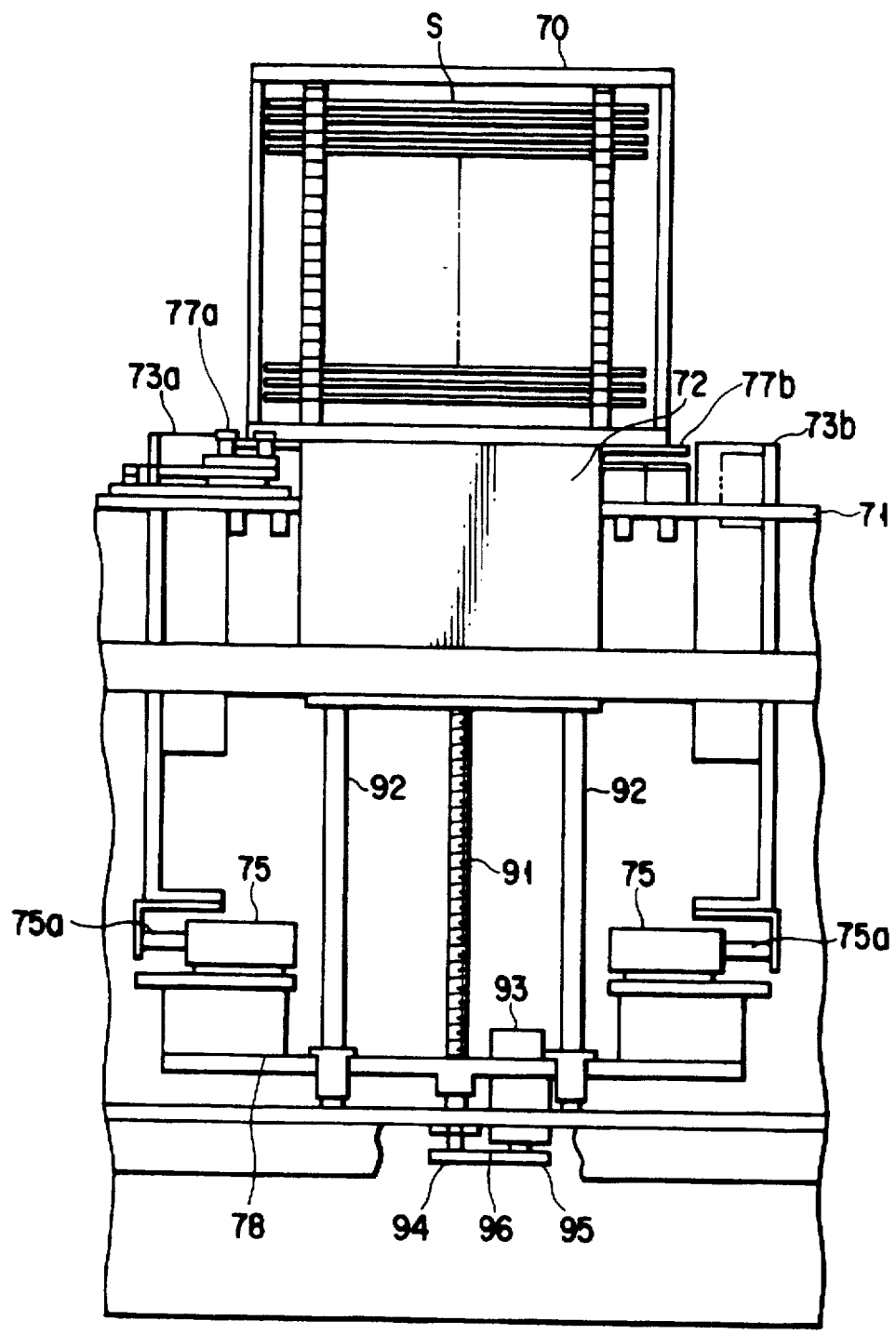
F I G. 12

MONITOR DEVICE AND MONITOR METHOD

This application is a Continuation of application Ser. No. 08/499,950, filed on Jul. 10, 1995, now abandoned.

BACKGROUND OF THE INVENTION

1. Field of the Invention

The present invention relates to a monitor device and a monitor method for monitoring objects to be processed, such as semiconductor wafers and LCD (liquid crystal display) substrates, in a processing apparatus for performing tests, film formation, etching, or the like for the objects.

2. Description of the Related Art

Various process steps such as film formation, etching, and electrical tests are performed in the manufacturing process of semiconductors or thin-film transistor liquid crystal displays (TFT-LCDs), and various processing apparatuses are used in these process steps.

As an example, an LCD prober for performing electrical tests for LCD substrates includes a test section for testing the electrical characteristics of LCD substrates by using a large number of probes, and a transfer section for conveying LCD substrates between a substrate storage section and the test section.

In the LCD prober of this sort, the state of alignment of LCD substrates in the test section is photographed by a television camera or the like and monitored on a CRT. However, information from other sections is displayed only as character information on another display unit. Consequently, the information is distributed, and it is difficult to accurately monitor an actual state in the processing apparatus. Additionally, operations of the apparatus are cumbersome since an operator must operate a keyboard while monitoring the image information on the CRT and the character information. Furthermore, not only in the LCD prober but in other processing apparatuses the internal information of the apparatus is displayed only as character information. This also makes it difficult to accurately monitor an actual state in the processing apparatus.

SUMMARY OF THE INVENTION

It is an object of the present invention to provide a monitor device and a monitor method capable of collectively and accurately monitoring the internal state of a processing apparatus.

It is another object of the present invention to provide a monitor device capable of avoiding cumbersome operations.

According to one aspect of the present invention, there is provided a monitor device for monitoring an object to be processed in a processing apparatus for performing predetermined processing for the object, the device comprising detecting means for detecting a position of the object in the processing apparatus, and display means for collectively displaying an image of an interior of the processing apparatus and displaying the position information of the object detected by the detecting means in the image of the processing apparatus.

According to another aspect of the present invention, there is provided a monitor device for monitoring an object to be tested in a test apparatus which includes a test section for testing the object, a test object storage section for storing the object, and a transfer section for conveying the object between the test object storage section and the test section, the device comprising imaging means used in alignment of the object in the test section, a sensor for sensing a position of the object in the transfer section, and display means for collectively displaying an image of an interior of the test apparatus and displaying the alignment state in the test section and the position information of the object in the transfer section in the image of the test apparatus.

According to still another aspect of the present invention, there is provided a monitor method of monitoring an object to be processed in a processing apparatus for performing predetermined processing for the object, the method comprising the steps of detecting a position of the object in the processing apparatus, and displaying the position information as image information on a display unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a plan view showing an LCD prober having a monitor device according to the present invention;

FIG. 2 is a front view of the LCD prober in FIG. 1;

FIGS. 7A to 7D are views showing practical examples of the displayed contents for displaying a convey operation of an LCD substrate in the prober;

FIG. 11 is a front view of a cassette loading section in the transfer mechanism in FIG. 9, showing the state in which alignment bars project; and FIG. 12 is a front view of the cassette loading section in the transfer mechanism in FIG. 9, showing the state in which the alignment bars retract.

DETAILED DESCRIPTION OF THE PREFERRED EMBODIMENTS

Figure 3:
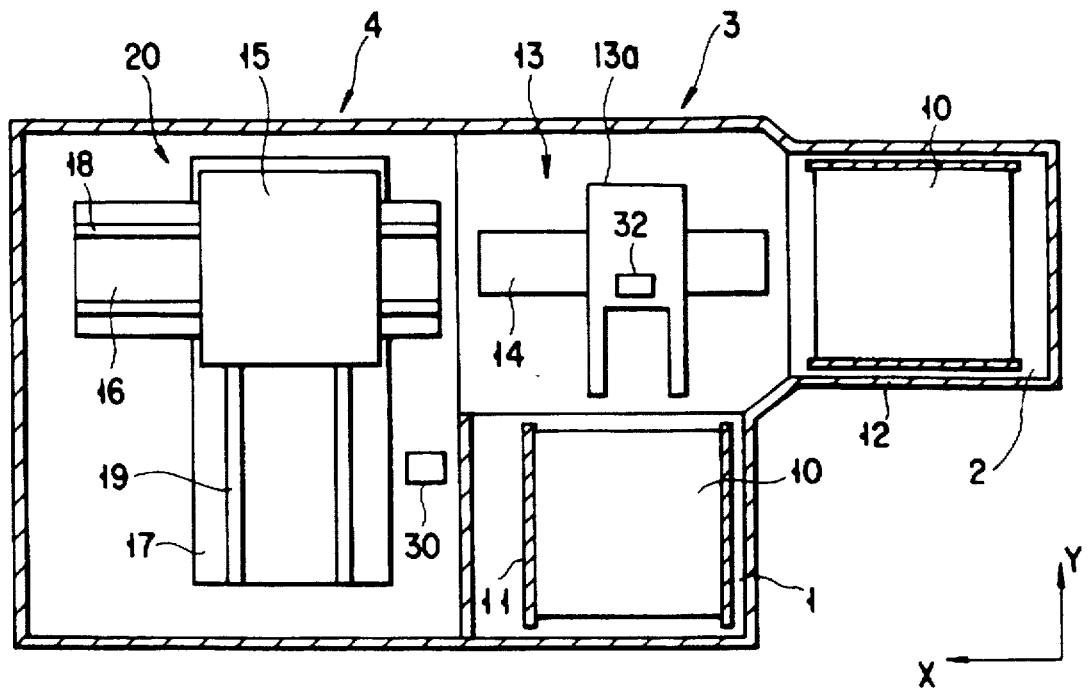
FIG. 3 is a partially sectional view showing the interior of the LCD prober in FIG. 1.

An embodiment of the present invention will be described in detail below with reference to the accompanying drawings.

An embodiment in which a monitor device according to the present invention is applied to an LCD prober will be described.

FIG. 1 is a plan view of the LCD prober having the monitor device of the present invention. FIG. 2 is a front view of the LCD prober.

As illustrated in FIGS. 1 and 2, this LCD prober includes LCD substrate storage sections 1 and 2, a loader section 3 for conveying LCD substrates, a test section 4 for performing electrical tests for LCD substrates, and a display panel 6 for displaying, e.g., the state of the LCD prober. A test head 7 is provided above the test section 4. This test head 7 accommodates a microscope 5 for viewing the interior of the test section 4 and a board for performing electrical tests for LCD substrates. Details of the display panel 6 will be described later.

The interior of the LCD prober will be described below with reference to FIGS. 3 and 4.

Cassettes 11 and 12 containing LCD substrates 10 (or being empty) are placed in the LCD storage sections 1 and 2, respectively.

The loader section 3 is equipped with a transfer mechanism 13 for conveying the LCD substrate 10. This transfer mechanism 13 can move in the X direction along a guide 14 and has an arm 13a which can move in the Y direction and the vertical direction and can also rotate.

The test section 4 has a test stage 20 which includes a chuck 15, a driving unit 15a, an X stage 16, and a Y stage 17. The chuck 15 holds the LCD substrate 10, and the driving unit 15a vertically moves and rotates the chuck 15. The X stage 16 moves the chuck 15 and the driving unit 15a in the X direction, and the Y stage 17 moves the X stage 16 in the Y direction. The X stage 16 has rails 18, and the Y stage 17 has rails 19. The chuck 15 and the driving unit 15a are moved in the X direction along the rails 18, and the X stage 16 is moved in the Y direction along the rails 19. The test section 4 incorporates a CCD camera 30 for optically alignment of the LCD substrate 10 at a position away from the test head 7 above the chuck 15.

Figure 4:
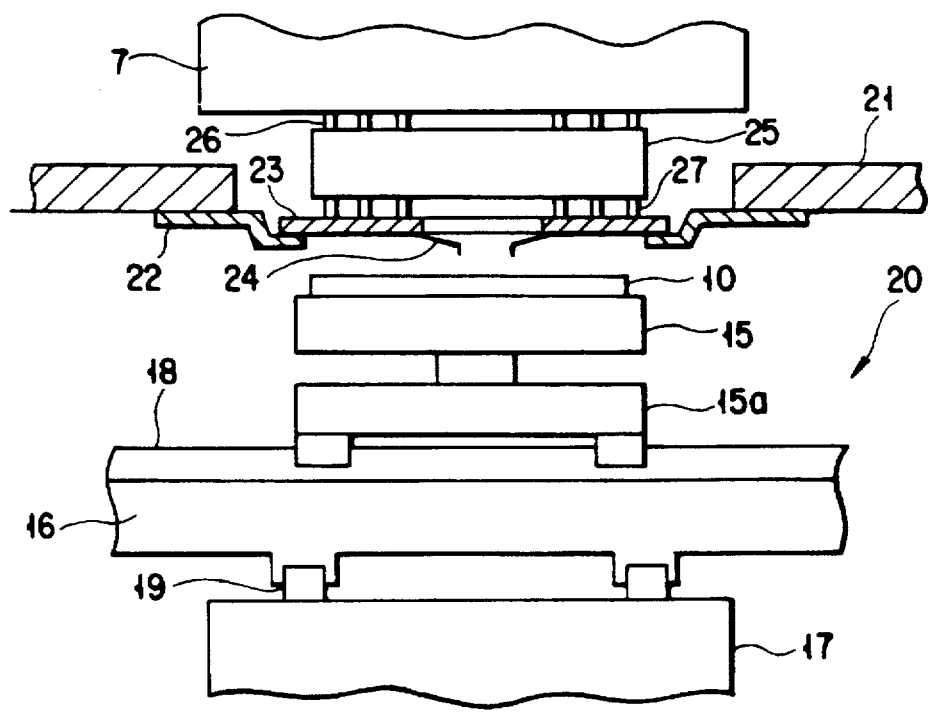
FIG. 4 is a view showing the interior of a test section of the LCD prober in FIG. 1.

As shown in FIG. 4, a probe card 23 having a large number of probes 24 for testing the electrical characteristics of the LCD substrate 10 is provided below the test head 7. These probes 24 are connected to the board (not shown) inside the test head 7 via a contact ring 25 having contact pins 26 and 27. The probe card 23 is fixed to a card holder 22 which is fixed to a head plate 21. As in FIG. 4, in performing a test, the chuck 15 holding the LCD substrate 10 is located immediately below the probe card 23. The chuck 15 is then raised, and a predetermined test is executed with the probes 24 and the electrodes of the LCD substrate 10 being in electrical contact with each other.

This LCD prober incorporates a sensor for sensing the position of the transfer arm 13a, and the transfer arm 13a has a sensor for sensing an LCD substrate placed on it. With these sensors, the presence/absence of a substrate on the transfer arm 13a and the position of a substrate in the prober are monitored. Optical sensors, ultrasonic sensors, and electrostatic capacitance sensors are examples of these sensors. Note that in FIG. 3, only a sensor 32 provided on the transfer arm 13a is illustrated as a representative of these sensors.

Figure 5:
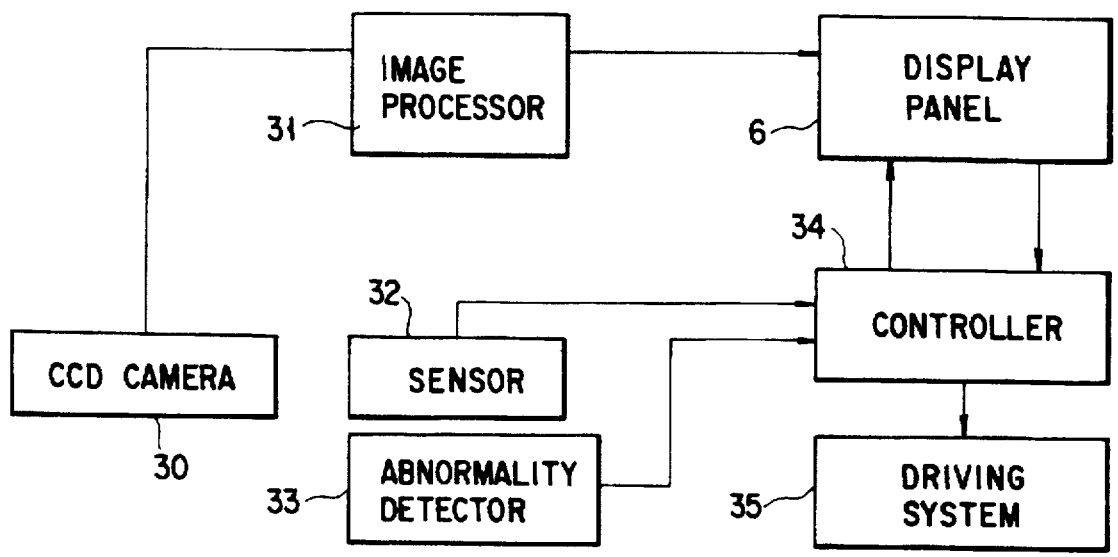
FIG. 5 is a block diagram showing the arrangement of the monitor device applied to the LCD prober in FIG. 1.

The arrangement of the monitor device of the above LCD prober will be described below with reference to FIGS. 5 and 6.

In addition to the display panel 6, the CCD camera 30, and the sensor 32 described above, this monitor device includes an image processor 31 for processing the image information from the CCD camera 30, an abnormality detector 33 for detecting abnormality in the prober, and a controller 34.

The display panel 6 is a touch panel type liquid crystal display having a flat surface. On the screen of the display panel 6, a setting display and a monitor display can be switched, and a plurality of setting displays and a plurality of monitor displays can also be switched. In setting the conditions of the prober and performing positioning in the test section 4, an operator depresses touch keys arranged on the panel.

Figure 6:
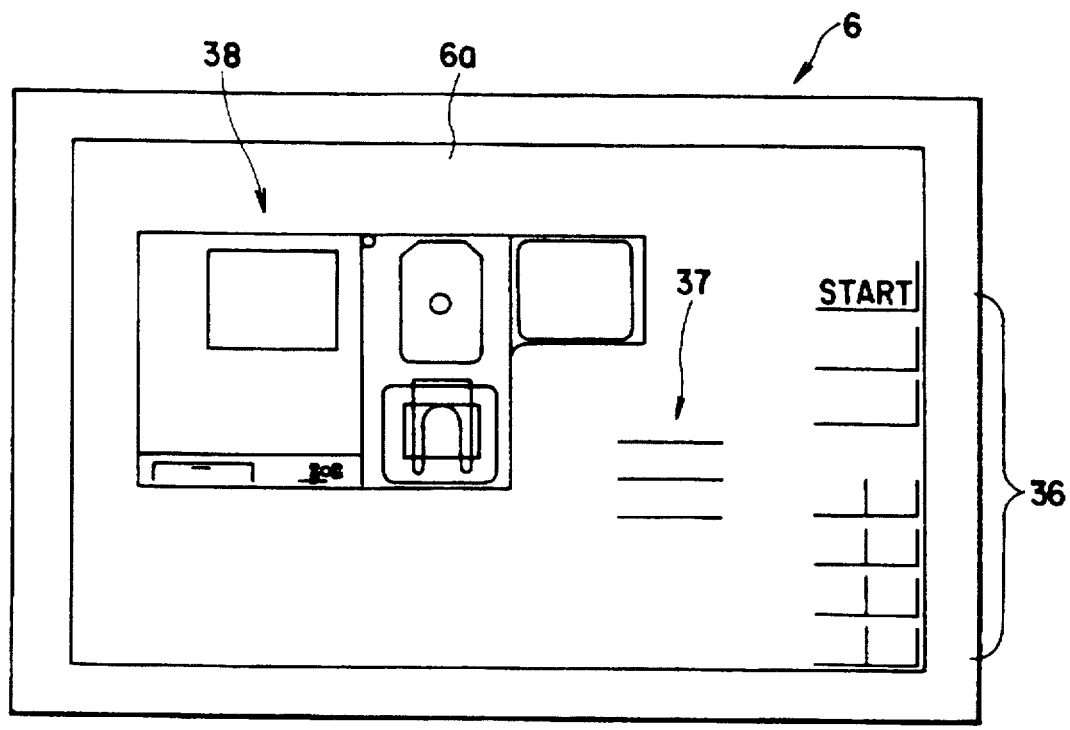
FIG. 6 is a view showing a practical example of the contents displayed on the monitor screen of a display panel.

FIG. 6 shows a practical example of the monitor display shown on the display panel 6. In FIG. 6, a screen 6a has touch keys 36, a data display region 37, and a prober interior display region 38. When the prober is in operation, the operator operates the touch keys 36 as needed while monitoring the data display region 37 and the prober interior display region 38.

The flows of signals in this monitor device will be described below. An image signal obtained by the CCD camera 30 is processed by the image processor 31 and output to the display panel 6. Detection signals from the sensors 32 are supplied to the controller 34 in which the signals are converted into image information. The image information is output to the display panel 6. When the display panel 6 is to be used as a setting screen, the display panel 6 outputs a setting signal to the controller 34. The controller 34 outputs the setting signal to a driving system 35, and the prober is set in a state corresponding to the setting signal. An abnormality detection signal from the abnormality detector 33 is supplied to the display panel 6 via the controller 34. Consequently, if an abnormality is detected, the occurrence of the abnormality is displayed on the display panel 6.

The operation of the prober having the monitor device with the above arrangement will be described below.

First, the operator switches the display panel to the setting screen mode and sets data, such as the substrate size, the panel index, the panel index count, and the highest substrate position, by using, e.g., ten keys assigned to the touch keys.

Subsequently, the mode of the screen of the display panel 6 is switched to a transfer operation display mode. In this operation display mode, monitor displays, such as shown in FIGS. 7A to 7D, in which the prober is viewed from the above are shown.

First, the arm 13a of the transfer mechanism 13 provided in the loader or transfer section 3 is inserted into the cassette 11 in the storage section 1, and the LCD substrate 10 is placed on the arm 13a. This state is displayed on the screen as in FIG. 7A. That is, in the prober interior display region 38 of the display screen 6a, an arm image 41 corresponding to the arm 13a is displayed in a portion corresponding to the cassette 11.

Subsequently, prealignment for conveying the LCD substrate 10 to the stage 20 of the test section 4 is performed in the loader section 3. This state is displayed on the screen as shown in FIG. 7B. That is, the arm image 41 is displayed in a portion corresponding to the loader or transfer section 3 in the prober interior display region 38. Note that the prealignment is accomplished by the corresponding touch keys 36 arranged on the screen.

Figure 7C:
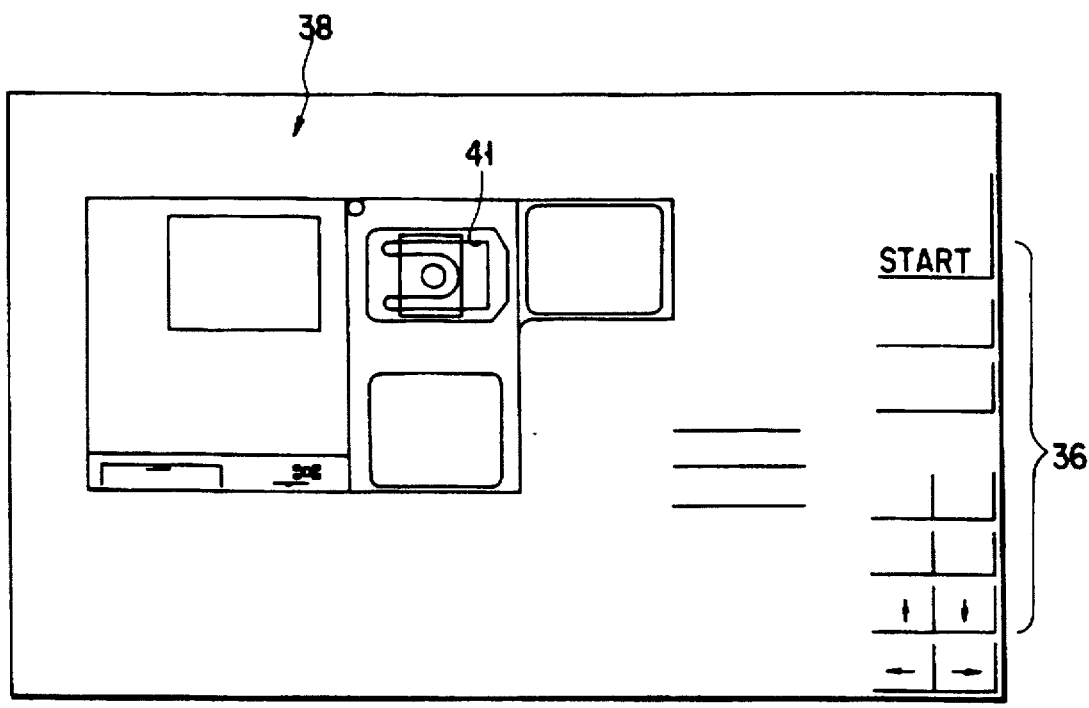
Figure 7D:
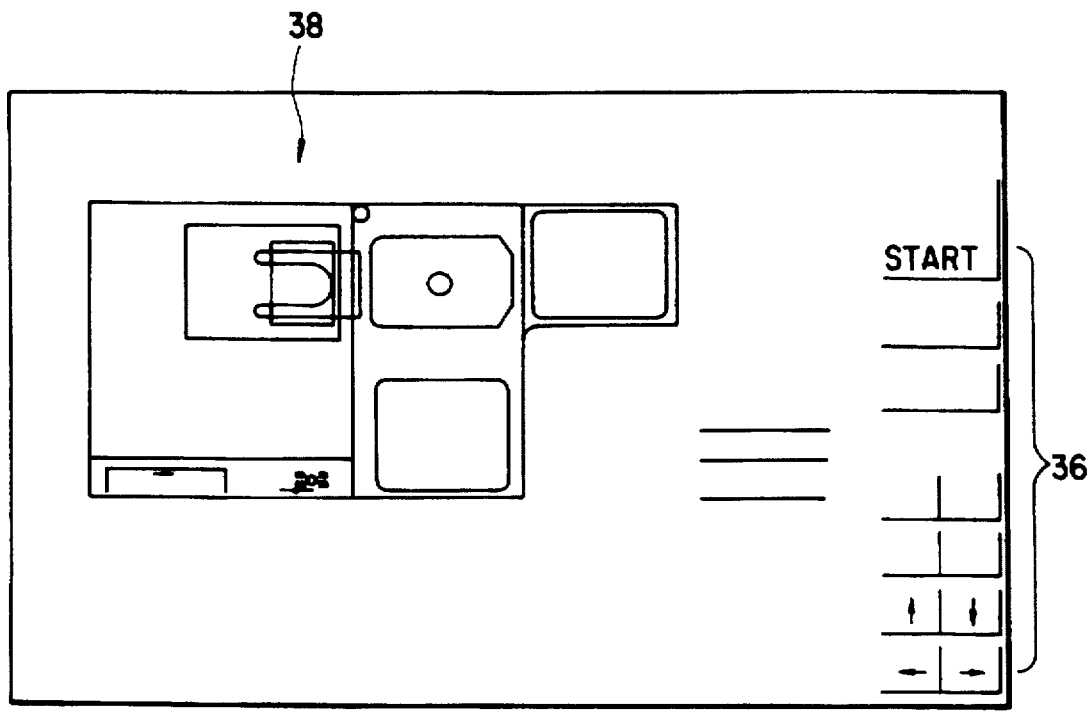

Thereafter, the arm 13a is rotated and extended in order to transfer the LCD substrate 10 to the stage 20 of the test section 4. This state is displayed on the screen as illustrated in FIGS. 7C and 7D. That is, in FIG. 7C, the arm image 41 which is displayed in the position corresponding to the loader section 3 in the prober interior display region 38 faces the stage 20. In FIG. 7D, the arm image 41 displayed on the screen indicates that the arm 13a is being moved to the stage 20.

The LCD substrate placed on the chuck 15 of the stage 20 is moved to the position below the CCD camera 30 incorporated in the test section 4. At that time, the mode of the screen of the display panel is switched to an alignment mode in which an alignment mark of the LCD substrate is displayed. While monitoring this screen, the operator performs alignment by depressing the touch keys.

After the alignment, the mode of the screen is again switched to the transfer operation display mode, and the LCD substrate 10 on the chuck 15 is moved to the position below the probe card 23. The chuck 15 is then moved upward to bring the probes 24 and the electrodes on the LCD substrate 10 into contact with each other, and the test is conducted in this state.

If any abnormality (error) occurs during the convey operation, the abnormality detector 33 detects this abnormality, and the abnormality information is displayed on the display panel. This allows the operator to rapidly and accurately recognize the state in which the abnormality has occurred, including the location of the abnormality, on the display.

According to the device as described above, an image of the interior of the prober can be displayed, so the states in the prober can be collectively, accurately monitored. In particular, even if the interior of the prober cannot be seen because the prober is covered, the interior of the prober can be visually monitored on the display panel. Also, since the mode of the display panel 6 can be switched between the transfer operation mode and the alignment mode, it is possible to accurately monitor the prober on a single display panel. Furthermore, the display panel 6 is a touch panel type liquid crystal display, so the conditions of the prober can be set using the touch keys assigned on the display screen. This obviates the need for a keyboard to result in an exceedingly improved operability. The operability is further improved because the flat panel facilitates depression of the touch keys. Moreover, even if an abnormality occurs, abnormality information is displayed on the display panel. Consequently, the operator can rapidly and accurately recognize the location of the abnormality and hence can quickly eliminate the abnormality.

Note that although the monitor device according to the present invention is applied to an LCD prober in the above embodiment, the present invention is not limited to this embodiment. For example, the present invention can be applied to other test apparatuses such as a wafer prober, and to processing apparatuses, rather than the test apparatuses, such as a film formation apparatus and an etching apparatus. In addition, in the above embodiment a CCD camera is used as the image pickup means, but another device such as an OCR can also be used.

A substrate transfer device suited for use with various processing apparatuses for performing, e.g., film formation, etching, and electrical tests, in the manufacturing process of LCD substrates will be described below.

In a processing apparatus for performing film formation, etching, or electrical tests for LCd substrates, a cassette containing a plurality of LCD substrates is placed on a cassette table of a loader section, and mapping and alignment are performed for the substrates in the cassette. Thereafter, a transfer arm provided in the loader section is used to pick up the LCD substrates one by one from the cassette and sequentially transfer them to the processing apparatus.

Figure 8:
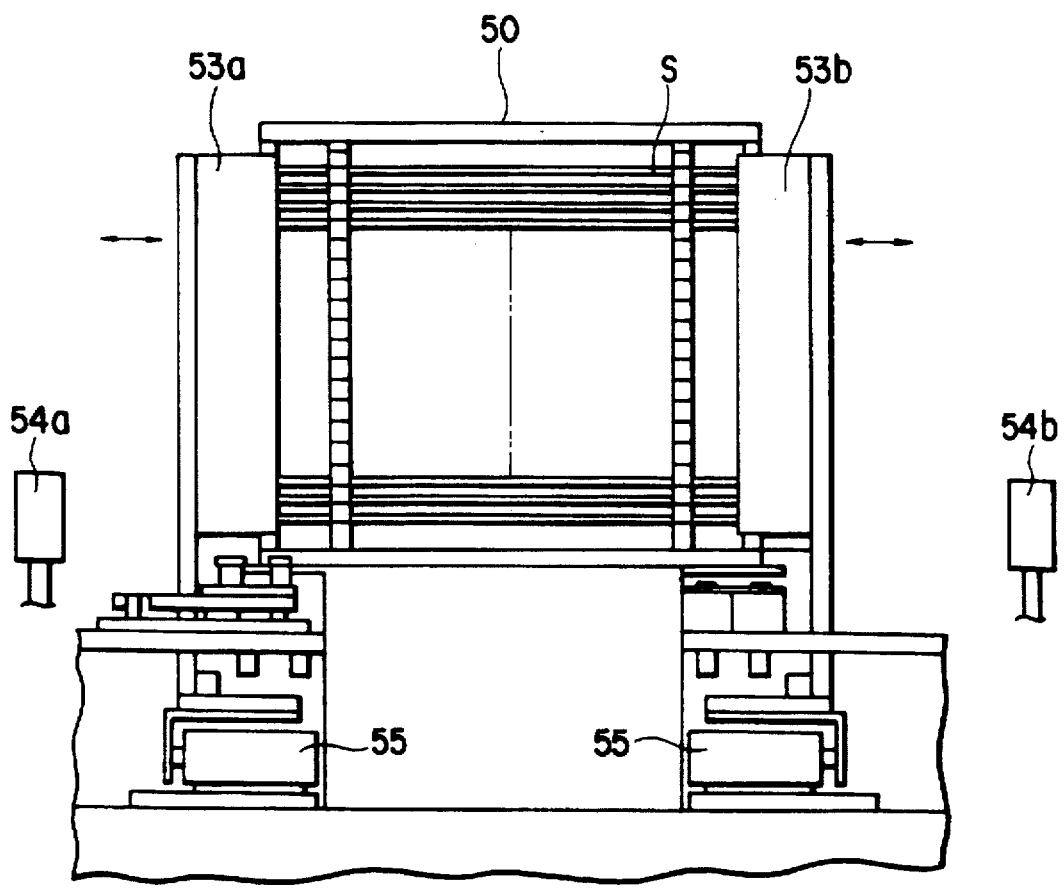
FIG. 8 is a view showing a conventional substrate transfer device.

In a conventional apparatus having the transfer mechanism as described above, as illustrated in FIG. 8, mapping of substrates S in a cassette 50 is performed by using a light-emitting element 54a and a light-receiving element 54b provided in the loader section. Alignment of the substrates S is done by clamping the substrates with a pair of alignment bars 53a and 53b by using a cylinder mechanism 55.

Unfortunately, in the transfer mechanism of the above sort, the mapping and the alignment of substrates must be independently performed, since the mapping and alignment of substrates are done by using the different members. This decreases the throughput and complicates the arrangement of the apparatus. Furthermore, the alignment bars projecting toward the position above the cassette table interfere with the convey operation of substrates.

To eliminate these inconveniences, therefore, it is possible to provide alignment members, such as the alignment bars described above, so as to project and retract with respect to the cassette table, and to attach a plate-like-object detector for detecting plate-like objects in a container (e.g., a cassette) to these alignment members. In this arrangement, with the alignment members being retracted, the container which contains a large number of plate-like objects is placed on the table. The alignment members are then projected to clamp the plate-like objects in the container to thereby align the materials. When the alignment members are projected or retracted, the plate-like objects in the container can be detected by the detector attached to the alignment members.

Such a transfer mechanism will be described below with reference to FIGS. 9 to 12.

Figure 9:
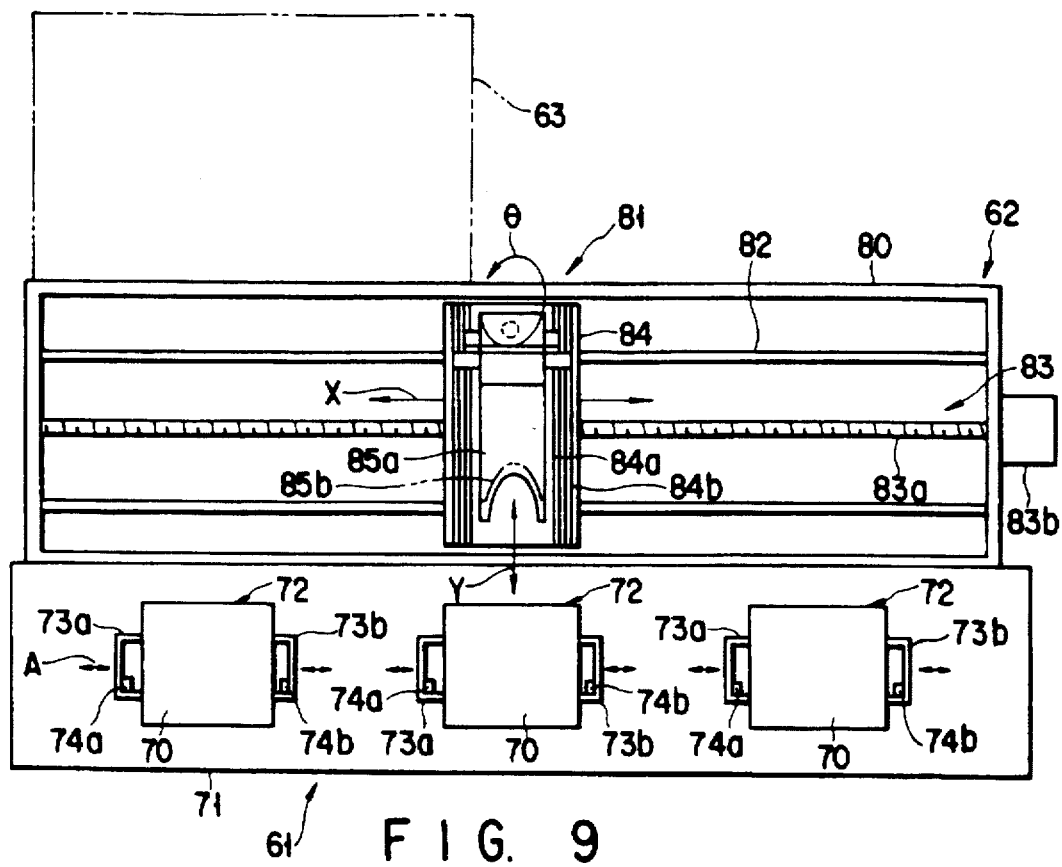
FIG. 9 is a plan view showing an LCD substrate transfer mechanism.
Figure 10:
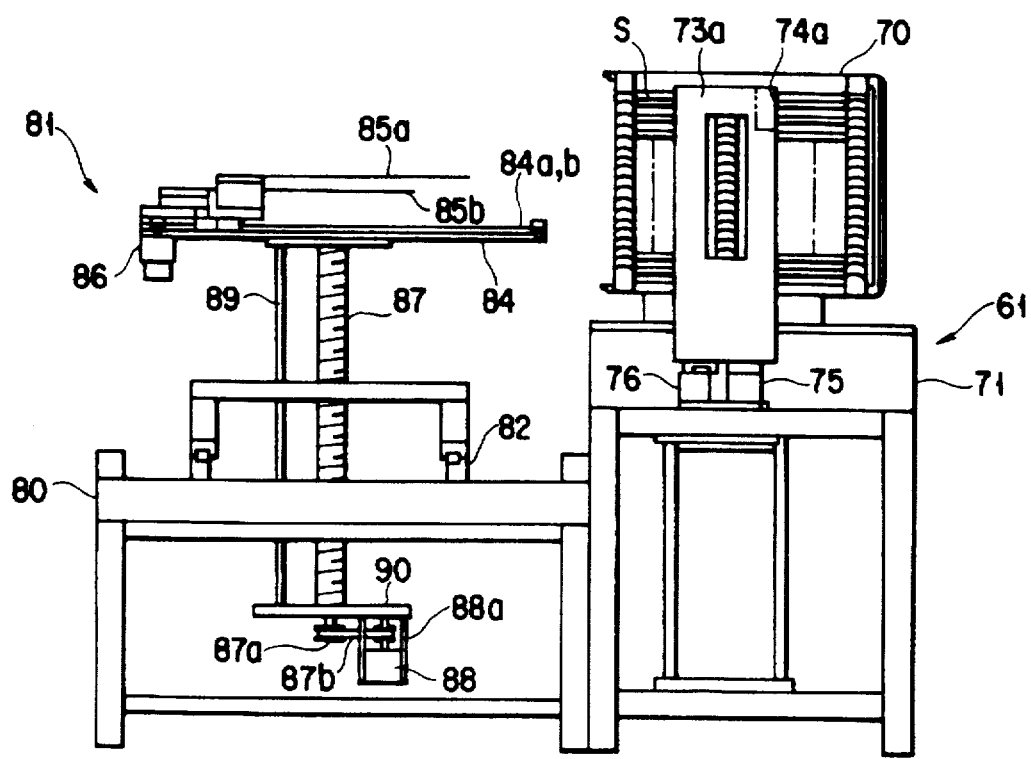
FIG. 10 is a side view showing the LCD substrate transfer mechanism.

FIG. 9 is a plan view showing this LCD substrate transfer mechanism, and FIG. 10 is a side view of the transfer mechanism. This transfer mechanism includes a cassette loading section 61 on which cassettes 70 each containing a large number of LCD substrates S (or being empty) are placed, and a transfer section 62. The transfer section 62 conveys the substrate S in the cassette 70 to a stage 63 of a processing apparatus (e.g., an LCD substrate test apparatus) or conveys the substrate on the stage 63 into the cassette 70.

The cassette loading section 61 has a cassette table 71 on which a plurality of (in FIG. 9, three) cassette loading positions 72 are provided. In each cassette loading position 72, a pair of alignment members 73a and 73b are disposed to be able to project and retract with respect to the table 71 as will be described later. Each of these alignment members 73a and 73b is a rectangular parallelpiped member whose one sectional surface is open, and is made of, e.g., an organic resin material. A light-emitting element 74a is attached to the upper end of the alignment bar 73a, and a light-receiving element 74b is attached to the alignment bar 73b. These light-emitting and light-receiving devices 74a and 74b constitute an optical substrate detector which enables mapping of the substrates S in the cassette 70. Note that reference numeral 75 denotes an air cylinder; and 76, a guide. With these members, the alignment bars 73a and 73b can be moved along an arrow A in FIG. 9.

The transfer section 62 includes a base member 80, a transfer unit 81 movable in the X direction along rails 82 on the base member 80, and a ball screw mechanism 83 for moving the transfer unit 81 in the X direction. This ball screw mechanism 83 has a ball screw 83a and a motor 83b for rotating the ball screw.

The transfer unit 81 has upper and lower transfer arms 85a and 85b which are independently moved by respective ball screw mechanisms in the Y direction along guide rails 84a and 84b provided on a support member 84. The transfer arms 85a and 85b are also vertically movable together with the support member 84. A ball screw 87 vertically extends downward from the support member 84, a timing pulley 87a is attached to the lower end of the ball screw 87, and a support plate 90 is arranged above the timing pulley 87a. A motor 88 is mounted on the lower side of the support plate 90, and a timing pulley 88a is attached to the rotating shaft of the motor. A timing belt 87b is looped between the timing pulleys 87a and 88a and transmits the rotation of the motor 88 to the ball screw 87, thereby achieving the vertical movement described above. As in FIG. 9, the transfer arms 85a and 85b can also be rotated in the direction θ by a motor 86. Note that reference numeral 89 denotes a rotation stopper for the support member 84.

The cassette loading section 61 will be described in more detail below with reference to FIGS. 11 and 12.

Each cassette loading position 72 has positioning mechanisms 77a and 77b for positioning the cassette 70.

The alignment bars 73a and 73b are supported by a support member 78 via the guide member 76. This support member 78 is threadably engaged with a ball screw 91 provided along the vertical direction. When the ball screw 91 is rotated by a motor 93, the support member 78 is vertically moved as it is guided by guide members 92. With this vertical movement, the alignment bars 73a and 73b are moved between the projection position (FIG. 11) at which they project from the table 71 and the retraction position (FIG. 12) in the table 71. Note that reference numerals 94 and 95 denote pulleys; and 96, a belt looped between the pulleys 94 and 95.

The cylinder 75 and the guide 76 mentioned previously are provided on the support member 78 for each of the alignment arms 73a and 73b. When a piston 75a of the cylinder 75 moves back and forth, the alignment bars 73a and 73b move in the direction indicated by an arrow A.

The operation of the transfer mechanism designed as above will be described below.

First, a robot (not shown) places the cassette 70 containing LCD substrates and the cassette 70 which is empty on the loading positions 72 of the table 71. The positioning mechanisms 77a and 77b position these cassettes 70. During this positioning, the alignment bars 73a and 73b are kept retracted to the table 71, as shown in FIG. 12.

Subsequently, the alignment bars 73a and 73b corresponding to the cassette 70 containing LCD substrates are moved to the projection position in FIG. 11. During this movement (or during the movement from the projection position to the retraction position), mapping for the LCD substrates S in the cassette 70 is performed by using the light-emitting element 74a and the light receiving element 74b attached to the alignment bars 73a and 73b, respectively. During the mapping, the pistons 75a of the cylinders 75 are extended to keep open the alignment bars 73a and 73b.

Thereafter, the pistons 75a of the cylinders 75 are retracted to move the alignment bars 73a and 73b inward. Consequently, the alignment bars 73a and 73b clamp the LCD substrates S in the cassette 70 and align the substrates S.

After the alignment, the alignment bars 73a and 73b are opened and moved downward to the retraction position. The transfer unit 81 of the transfer section 2 conveys the LCD substrates S one by one from the cassette 70 to the stage 63. More specifically, the transfer arms 85a and 85b are inserted into the cassette 70, and the LCD substrate S is placed on them. The transfer arms 85a and 85b are then rotated 180° and at the same time moved to a predetermined position on the stage 63. The substrate is moved downward to that position.

The substrate thus moved downward on the stage 63 is conveyed by a transfer unit (not shown) of the processing apparatus to a position at which processing such as a test is performed. After the predetermined processing is performed for the substrate, the substrate is again conveyed to the stage 63.

The processed substrate is conveyed from the stage 63 to the empty cassette 70 by the arms 85a and 85b. During the convey operation, the alignment bars 73a and 73b are kept retracted in the open state.

As described above, the alignment bars 73a and 73b can be projected and retracted with respect to the table 71. Therefore, in conveying an LCD substrate, the alignment bars 73a and 73b can be retracted and thereby prevented from interfering with the substrate transfer operation. Additionally, since the light-emitting element 74a and the light-receiving element 74b, which constitute an optical substrate detector, are integrally attached to the alignment bars 73a and 73b, respectively, mapping and alignment of substrates can be performed by the integral detector. Accordingly, it is possible to reduce the number of parts and convey the substrate with a high throughput. Furthermore, the efficiency is extremely high because mapping is done while the alignment bars 73a and 73b are being projected.

Note that the transfer mechanism is applied to a convey operation of LCD substrates in the above embodiment, but the application of this transfer mechanism is not restricted to the one in this embodiment. For example, the transfer mechanism is similarly applicable to some other plate-like material such as a semiconductor wafer. Also, the detector for detecting a plate-like material is not limited to the light-emitting and light-receiving elements used in the embodiment.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A monitor device for monitoring an object to be processed in a processing apparatus for performing predetermined processing for the object and wherein said object is one of an LCD substrate and a semiconductor substrate, said device comprising:

detecting means for detecting a position of the object in said processing apparatus; and display means for displaying an image of an interior of said processing apparatus and of an object disposed in said interior of said processing apparatus, and wherein said image of said interior includes a test section, an object storage section and a transfer section, such that said image displayed by said display means provides position information of the object detected by said detecting means with respect to the interior of said processing apparatus.

2. The device according to claim 1, wherein said display means has a display screen including touch keys, said touch keys on said display screen being operable in accordance with the image information displayed on said display screen.

3. The device according to claim 1, wherein a display screen of said display means is a liquid crystal display screen.

4. The device according to claim 1, further comprising an abnormality detector, so that when said abnormality detector detects an abnormality, abnormality information is displayed on said display means.

5. The device according to claim 2, further comprising an abnormality detector, so that when said abnormality detector detects an abnormality, abnormality information is displayed on said display screen of said display means.

6. A monitor device as recited in claim 1, wherein said display means sequentially displays images to depict movement of the object with respect to the interior of the processing apparatus during a transfer operation.

7. A monitor device as recited in claim 1, wherein said image includes an image of an arm upon which the object is disposed during a transfer operation.

8. A monitor device as recited in claim 1, wherein said display means displays alignment information of said object separate from said image which provides position information.

9. A monitor device as recited in claim 8, wherein said display means includes a first mode and a second mode and said display means is selectively switched between said first mode and said second mode, and wherein said alignment information is displayed in said first mode and said image which provides position information is displayed in said second mode.

10. A monitor device as recited in claim 12, wherein said display means displays alignment information of said object separate from said image which provides position information.

11. A monitor device as recited in claim 10, wherein said display means includes a first mode and a second mode and said display means is selectively switched between said first mode and said second mode, and wherein said alignment information is displayed in said first mode and said image which provides position information is displayed in said second mode.

12. A monitor device for monitoring an object to be tested in a test apparatus which includes a test section for testing the object, a test object storage section for storing the object, and a transfer section for conveying the object between said test object storage section and said test section, said device comprising:

imaging means used in alignment of the object in said test section;

a sensor for sensing a position of the object in said transfer section; and display means for displaying an image of an interior of said test apparatus and of the object disposed in the interior of said test apparatus, said display means also displaying the alignment state of the object in said test section, and wherein said image of said interior includes a test section, an object storage section and a transfer section, such that said image displayed by said display means provides position information of the object with respect to said interior of said test apparatus.

13. A device according to claim 12, wherein said display means has a display screen including touch keys, said touch keys on said display screen being operable in accordance with the image information displayed on said display screen.

14. A device according to claim 12, wherein a display screen of said display means is a liquid crystal screen.

15. A device according to claim 12, further comprising an abnormality detector, so that when said abnormality detector detects an abnormality, abnormality information is displayed on said display means.

16. A device according to claim 12, wherein said imaging means has a CCD camera and an image processor.

17. A monitor device as recited in claim 12, wherein said display means sequentially displays images to depict movement of the object with respect to the interior of the test apparatus during a transfer operation.

18. A monitor device as recited in claim 12, wherein said image includes an image of an arm upon which the object is disposed during a transfer operation.

19. A monitor method of monitoring an object to be processed in a processing apparatus for performing predetermined processing for the object and wherein said object is one of an LCD substrate and a semiconductor substrate, comprising the steps of:

detecting a position of the object in said processing apparatus; and displaying an image on a display unit with the image of an interior of the processing apparatus and of the object disposed in the interior of the processing apparatus, and wherein said image of said interior includes a test section, an object storage section and a transfer section, such that said image provides position information of the object with respect to the interior of said processing apparatus.

20. A monitor method as recited in claim 19, further including sequentially displaying images of the object with respect to the image of the interior of the processing apparatus during a transfer operation of the object to depict movement of the object during the transfer operation.

21. A monitor method as recited in claim 19, wherein the step of displaying an image includes displaying an image of an arm upon which the object is disposed during a transfer operation.

22. A monitor method as recited in claim 19, further including displaying alignment information of said object separate from said image which provides position information.

23. A monitor method as recited in claim 22, further including providing a display which is switchable between a first mode and a second mode, the method further including switching said display to said first mode to display alignment information, and switching said display to said second mode to display said image which provides position information.

24. A monitor device for monitoring an object to be processed in a processing apparatus for performing predetermined processing for the object and wherein said object is one of an LCD substrate and a semiconductor substrate, said device comprising:

detecting means for detecting a position of the object in said processing apparatus;

display means for displaying an image of an interior of said processing apparatus and of an object disposed in said interior of said processing apparatus, such that said image displayed by said display means provides position information of the object detected by said detecting means with respect to the interior of said processing apparatus; and wherein said display means displays alignment information of said object separate from said image which provides position information.

25. A monitor device as recited in claim 24, wherein said display means includes a first mode and a second mode and said display means is selectively switched between said first mode and said second mode, and wherein said alignment information is displayed in said first mode and said image which provides position information is displayed in said second mode.

26. A monitor method of monitoring an object to be processed in a processing apparatus for performing predetermined processing for the object and wherein said object is one of an LCD substrate and a semiconductor substrate, comprising the steps of:

detecting a position of the object in said processing apparatus;

displaying an image on a display unit with the image of an interior of the processing apparatus and of the object disposed in the interior of the processing apparatus such that said image provides position information of the object with respect to the interior of said processing apparatus; and the method further including displaying alignment information of said object separate from said image which provides position information.

27. A monitor method as recited in claim 26, further including providing a display which is switchable between a first mode and a second mode, the method further including switching said display to said first mode to display alignment information, and switching said display to said second mode to display said image which provides position information.

* * * * *